(12) United States Patent
Tio et al.

(10) Patent No.: US 9,655,271 B2
(45) Date of Patent: May 16, 2017

(54) MOTOR DRIVE WITH INHERENT POWER ISOLATION

(71) Applicant: Rockwell Automation Asia Pacific Business Center Pte. Ltd., Singapore (SG)

(72) Inventors: Donald Yuen Leong Tio, Singapore (SG); Yang Yueng Melvin Yap, Singapore (SG)

(73) Assignee: Rockwell Automation Asia Pacific Business Center, Singapore (SG)

( * ) Notice: Subject to any disclaimer, the term of this patent is extended or adjusted under 35 U.S.C. 154(b) by 457 days.

(21) Appl. No.: 14/053,096

(22) Filed: Oct. 14, 2013

(65) Prior Publication Data

US 2015/0077955 A1    Mar. 19, 2015

(30) Foreign Application Priority Data

Sep. 13, 2013 (SG) .............................. 201306922-4

(51) Int. Cl.
    *H05K 7/14* (2006.01)
(52) U.S. Cl.
    CPC .................................. *H05K 7/1432* (2013.01)
(58) Field of Classification Search
    CPC ...... H02K 11/0073; H02K 9/02; H02P 27/04; H02P 31/00; H05K 7/1432; H05K 1/144; H05K 1/181; H05K 2201/0537; G05B 19/29; G05B 19/02; F16P 3/00
    USPC ....... 361/752, 758, 688, 809, 825, 784, 622, 361/658, 676, 638, 624, 331, 335, 347, 361/399, 377, 395, 759, 648, 611, 637; 318/34, 85, 111, 494, 560, 569, 600, 625, 318/519, 772, 105, 490; 700/72, 95; 363/144, 146, 141, 147, 157; 174/68.2, 174/71, 88, 99, 72; 200/50, 144; 312/223.2; 307/328; 327/581; 315/276
    See application file for complete search history.

(56) References Cited

U.S. PATENT DOCUMENTS

| | | | | |
|---|---|---|---|---|
| 4,293,764 A | * | 10/1981 | Amrhein | .................... 200/302.2 |
| 4,750,091 A | | 6/1988 | Van Hout | |
| 4,931,898 A | * | 6/1990 | Cole | ...................... H02B 1/056 361/645 |

(Continued)

OTHER PUBLICATIONS

Extended EP Search Report for EP Application No. 14181289 Mailed May 10, 2016; 11 Pages.

*Primary Examiner* — Zachary M Pape
*Assistant Examiner* — Amir Jalali
(74) *Attorney, Agent, or Firm* — Fletcher Yoder PC

(57) ABSTRACT

A motor drive comprises a power sub-assembly and a control sub-assembly. The control sub-assembly includes components that may be accessed within the sub-assembly housing during installation and maintenance of the drive. A main circuit board is configured to define a high voltage region and a low voltage region. The high voltage region is isolated by an interior barrier of the housing so that the components can be conveniently accessed. An operator interface is provided in the control sub-assembly. An interface circuit board is also isolated by the barrier. Desired spacing between the interface circuit board and a surface of the interface is provided by integrally molded spring structures and plungers that interface with underlying switches.

20 Claims, 7 Drawing Sheets

(56) References Cited

U.S. PATENT DOCUMENTS

| | | | | |
|---|---|---|---|---|
| 5,019,938 A * | 5/1991 | Sridharan | | F21V 23/00 174/DIG. 2 |
| 5,214,360 A * | 5/1993 | Gonser | | A61G 15/02 297/330 |
| 5,666,268 A | 9/1997 | Rix et al. | | |
| 5,675,223 A * | 10/1997 | Yoshizawa et al. | | 318/139 |
| 5,969,965 A * | 10/1999 | Byrne et al. | | 363/144 |
| 6,091,604 A * | 7/2000 | Plougsgaard | | H02M 7/003 165/185 |
| 7,272,003 B2 * | 9/2007 | Pleines | | H02G 5/10 174/16.1 |
| 7,608,039 B1 * | 10/2009 | Todd | | 600/112 |
| 7,712,678 B2 * | 5/2010 | Mizukoshi | | 236/94 |
| 2001/0036098 A1 * | 11/2001 | Larikka | | 363/157 |
| 2003/0174465 A1 * | 9/2003 | Isozumi et al. | | 361/688 |
| 2004/0022041 A1 * | 2/2004 | Bergmann | | H02M 7/003 361/784 |
| 2005/0189889 A1 * | 9/2005 | Wirtz et al. | | 8/105 |
| 2009/0033410 A1 * | 2/2009 | Nelson | | H03K 17/567 327/581 |
| 2010/0123425 A1 * | 5/2010 | Campbell | | G05B 19/408 318/600 |
| 2011/0206544 A1 * | 8/2011 | Saito | | F04B 39/121 417/410.1 |
| 2011/0304957 A1 * | 12/2011 | Lunden | | H02B 1/14 361/622 |
| 2013/0049550 A1 | 2/2013 | Watanabe et al. | | |
| 2014/0028029 A1 * | 1/2014 | Jochman | | G05F 1/02 290/1 A |
| 2014/0084837 A1 * | 3/2014 | Tio et al. | | 318/519 |
| 2014/0084841 A1 * | 3/2014 | Middlestetter et al. | | 318/772 |
| 2014/0140018 A1 * | 5/2014 | Malek | | H04M 1/0277 361/749 |
| 2015/0208524 A1 * | 7/2015 | Kontani | | H05K 7/1432 361/752 |
| 2015/0306960 A1 * | 10/2015 | Sobu | | H02M 1/44 307/10.1 |

\* cited by examiner

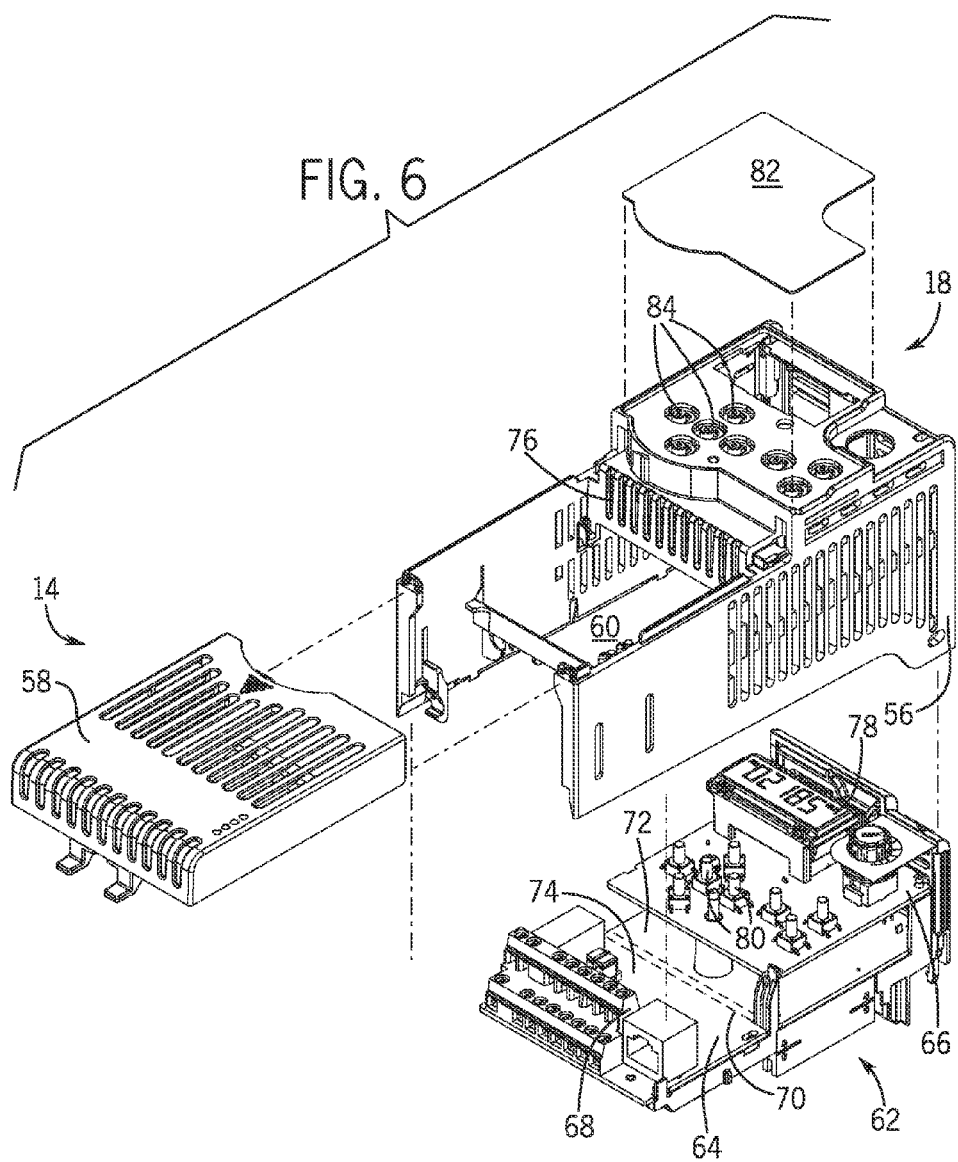

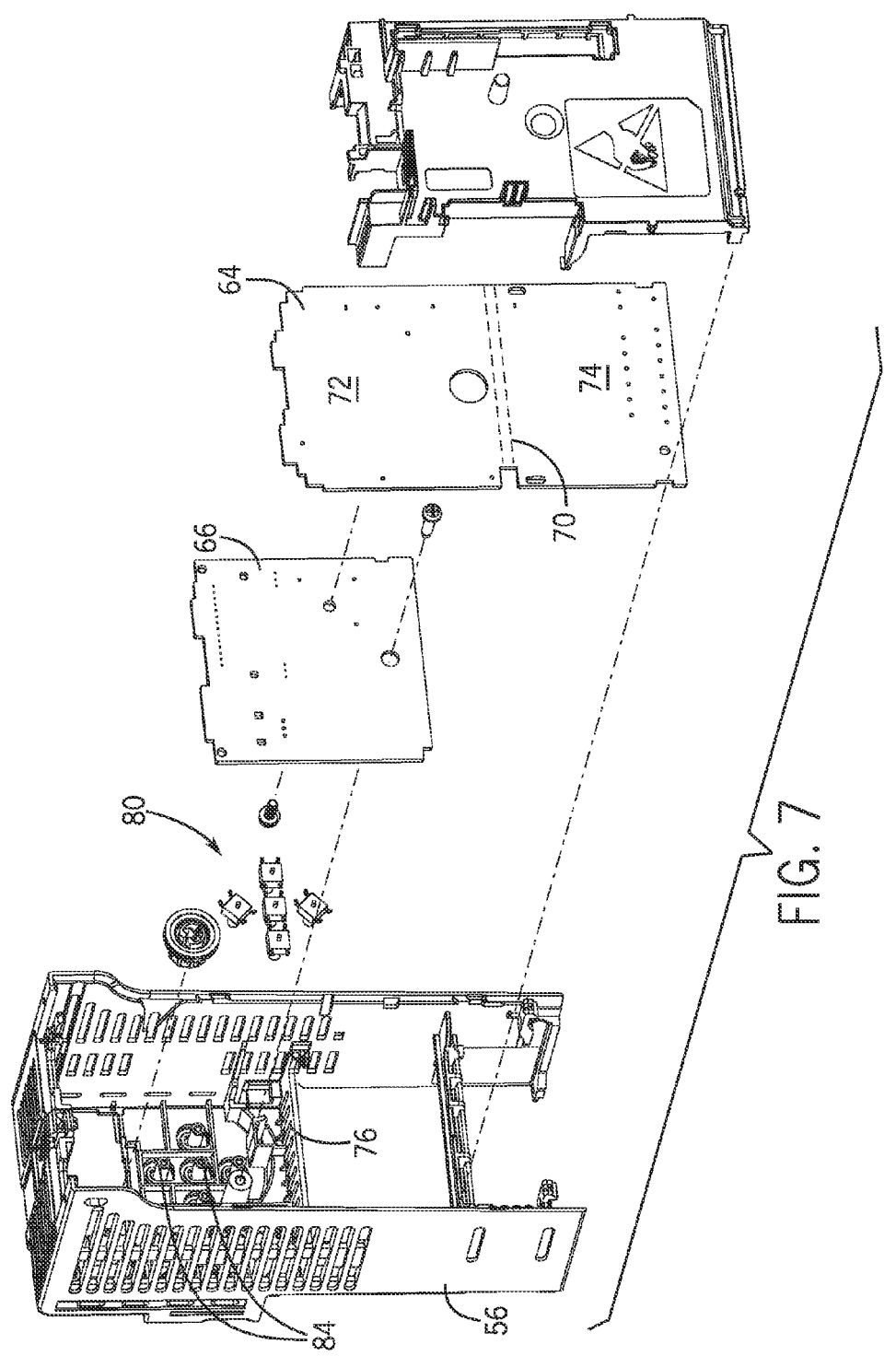

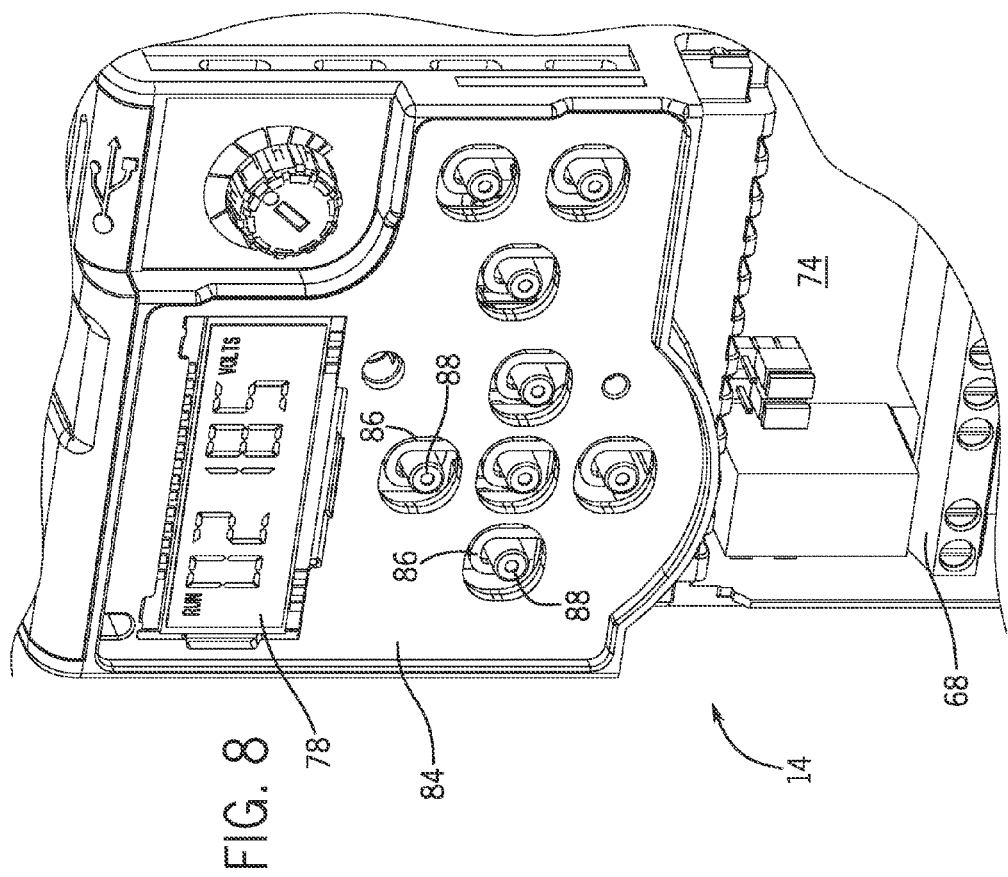

MOTOR DRIVE WITH INHERENT POWER ISOLATION

CROSS REFERENCE TO RELATED APPLICATIONS

This application claims priority to Singapore Patent Application No. 201306922-4 entitled "Motor Drive with Inherent Power Isolation," filed on Sep. 13, 2013, which is herein incorporated by reference.

BACKGROUND

The present invention relates generally to drive systems for powering electric motors, and more particularly to a modular drive system designed and adapted for controlling motors of various sizes and ratings.

A myriad of applications exist in industry for electric motors of various types. In many applications, induction motors are driven to rotate loads, such as pumps, fans, conveyors, to mention only a few. Other types of motors may similarly be driven. A load may call for uniform speed and torque throughout its life, although many applications require much more flexible control. That is, a motor may need to be driven at different speeds and with different torques at different stages in its operation. To accommodate such needs, variable speed motor drives have been developed that allow for output waveforms of varying and controllable frequency, capable of correspondingly varying the speeds of driven motors. Similarly, equipment has been developed for soft starting motors, starting and stopping motors in controlled manners, and so forth. Such motor drives are now ubiquitous throughout industrial, commercial, shipping, material handling, and other applications.

In general, motor drives are designed to provide good service life in a range of conditions and with a range of loads. The drives may be designed around a single package that can be programmed and wired to receive input power as well as to output conditioned power to the electric motor. Such packaged products typically include power conditioning circuitry that receives alternating current (AC) input, and converts the AC input to a DC form, before reconverting the DC power to controlled frequency AC output. Various operator interfaces and programming platforms may also be provided, as well as networking capabilities.

One particular challenge that arises in such products is the design for various components of the package that allow for ease of manufacturing, while providing desired electrical properties, both for control level signals and for power signals. For example, low level logic signals will typically be used for certain control, such as on the order of 5 v DC or less, while higher voltage signals, such as on the order of 110 v AC, 220 v AC, or three-phase 440 v AC may be used for powering the driven motor. The actual voltages (and frequencies and currents) may vary depending upon the standards in the countries or areas where the equipment is used. However, all such equipment must accommodate both high and low level signals.

In many systems, optocouplers and similar signal isolation devices may be used to separate signals of different levels, particularly logic signals from power signals and boards. Such devices can add significantly to the cost of the equipment, particularly where multiple such devices are needed. Moreover, providing proper isolation and distances within the packages, such as between operator interfaces and powered circuit boards is always a challenge.

There is a need, therefore, for improved techniques for driving electric motors that can respond to such design challenges.

BRIEF DESCRIPTION

The present invention provides a motor drive system and method designed to respond to these needs. In accordance with aspects of the invention, a motor drive system comprises a motor drive comprising a control sub-assembly main circuit board subdivided into a high voltage region and a low voltage region, and a housing having an interior in which the control sub-assembly main circuit board is disposed. At least one component is disposed in the interior and designed to be accessed by an operator during installation and/or maintenance of the motor drive, and a barrier is disposed in the housing to limit access to the high voltage region of the control sub-assembly main circuit board while allowing access to the at least one component.

In accordance with other aspects of the invention, a motor drive system comprises a motor drive that includes a control sub-assembly main circuit board subdivided into a high voltage region and a low voltage region, and a housing with an interior in which the control sub-assembly main circuit board is disposed. At least one component is disposed in the interior and designed to be accessed by an operator during installation and/or maintenance of the motor drive, and a barrier is disposed in the housing to limit access to the high voltage region of the control sub-assembly main circuit board while allowing access to the at least one component. An operator interface is disposed over the high voltage region of the control sub-assembly main circuit board, wherein access to the operator interface is limited by the barrier, and wherein the housing comprises spacing plungers that provide a desired spacing between the surface of the operator interface and an underlying circuit board.

The invention also provides a motor drive comprising a control sub-assembly main circuit board subdivided into a high voltage region and a low voltage region, and a housing with an interior in which the control sub-assembly main circuit board is disposed. An operator interface is disposed over the high voltage region of the control sub-assembly main circuit board, wherein the housing comprises an array of integral spring structures that are deformed by an operator interacting with the interface.

DRAWINGS

These and other features, aspects, and advantages of the present invention will become better understood when the following detailed description is read with reference to the accompanying drawings in which like characters represent like parts throughout the drawings, wherein:

FIG. 6 is a top perspective view of the control sub-assembly with a top cover and operator interface membrane removed;

FIG. 7 is a bottom perspective exploded view of the control sub-assembly illustrating the housing, interface board, and main circuit board of the control sub-assembly;

FIG. 8 is a more detailed view of the housing and illustrating an exemplary embodiment of integral spring structures for the operator interface;

DETAILED DESCRIPTION

Figure 1:
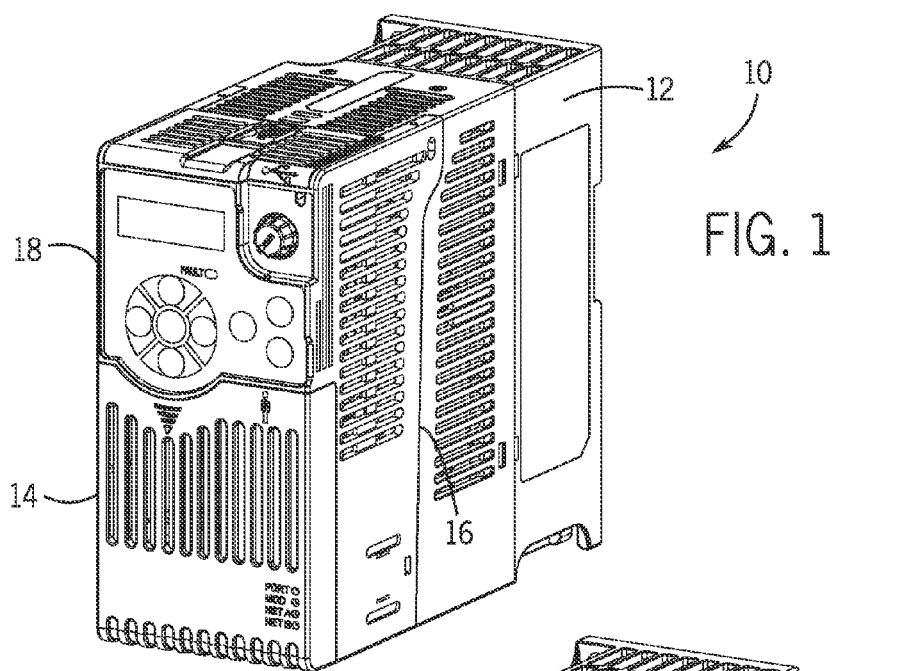
FIG. 1 is a perspective view of an exemplary motor drive system in accordance with aspects of the present techniques.

FIG. 1 illustrates an exemplary motor drive system 10 designed to power an electric motor such as an induction motor. The motor drive system essentially consists of a power sub-assembly 12 and a control sub-assembly 14 which is designed to be secured to and attached to the power sub-assembly during operation. A mechanical interface 16 allows for mating of the sub-assemblies and the control sub-assembly may be held on to the power sub-assembly in various manners, such as via snaps, fasteners, and the like. However, in a presently contemplated embodiment, the control sub-assembly and the power sub-assembly are physically configured to allow the control sub-assembly to be secured to the power sub-assembly via interfacing surfaces, such that the control sub-assembly may be attached and detached form the power sub-assembly by hand and without the use of tools. This ability to toollessly attach and detach the control sub-assembly greatly facilitates programming, reprogramming, commissioning and servicing of the system. An operator interface 18 is shown on a front face of the control sub-assembly and may allow for certain user interactions with the drive, such as to view configuration parameters, alter configuration parameters, view logs, history, error and other codes, view certain operational parameters (e.g., currents, voltages, speeds) and so forth. In a present embodiment, the operator interface comprises an LCD module that supports multiple languages, and is able to display parameter codes followed by dynamic descriptions.

Figure 2:
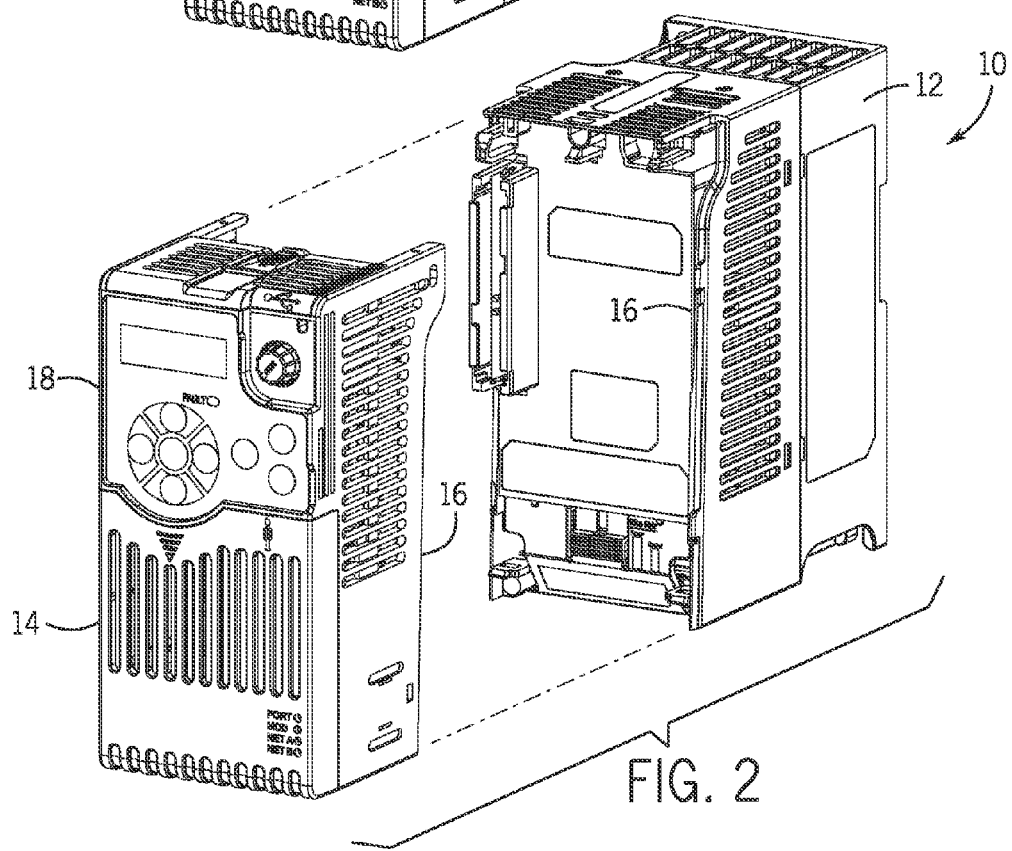
FIG. 2 is a similar perspective view of the system of FIG. 1 with a control sub-assembly removed from a power sub-assembly.

As shown in FIG. 2, the control sub-assembly is removable from the power sub-assembly 12, such as for configuration (programming), servicing, and so forth. As discussed more fully below, the control sub-assembly may be removed from the power sub-assembly without disconnecting the power sub-assembly from either the power supply (e.g., upstream power circuitry) or from the electric motor once places in service. As also discussed below, the packaging arrangement disclosed provides for separation of different signals, particularly by voltage level, as well as distancing higher voltage sections of the control circuitry from a touchpad-type interface, thereby facilitating handling of the equipment, connection of input/output, manipulation of the interface.

Figure 3:
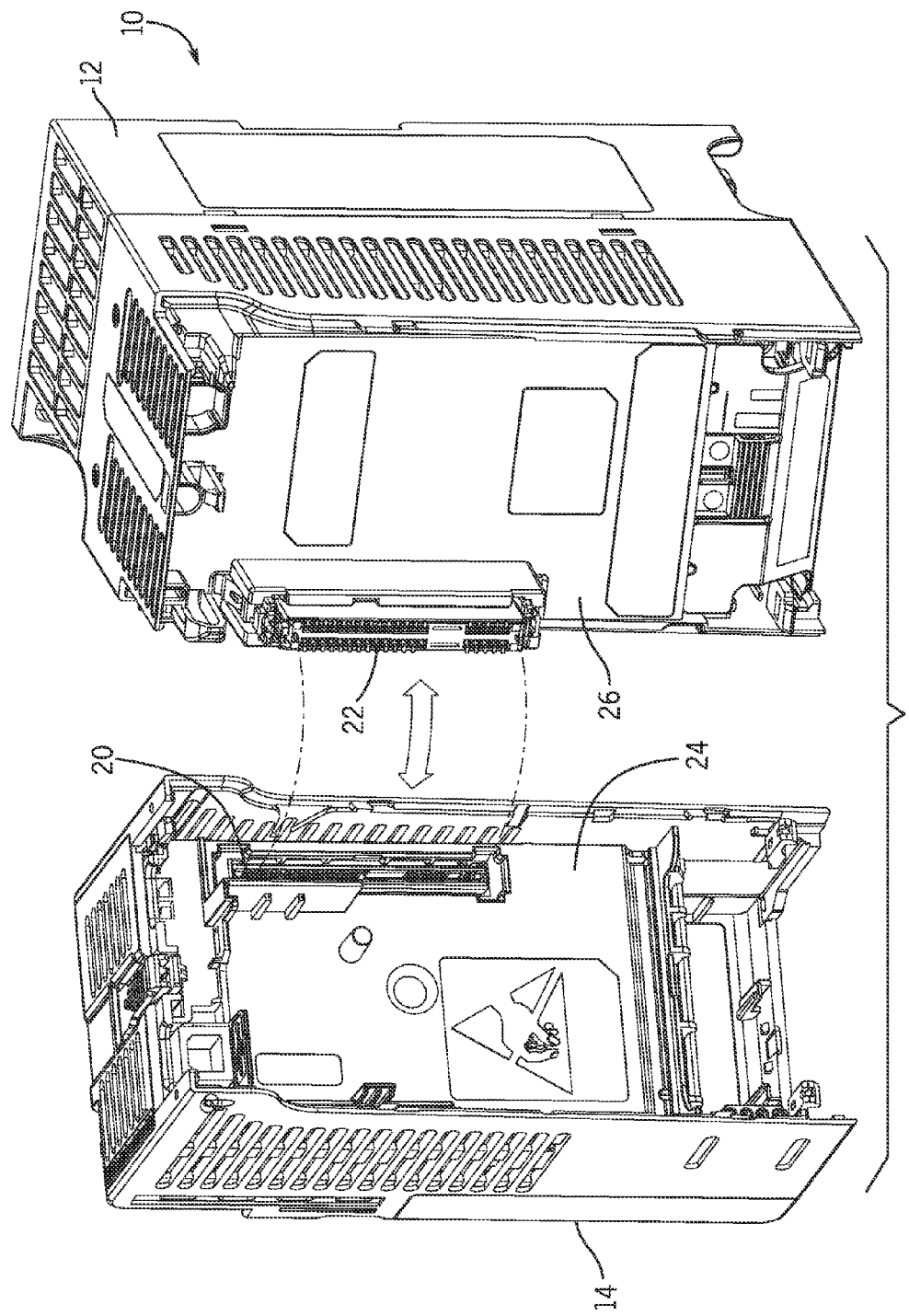
FIG. 3 is a perspective view of the control sub-assembly and power sub-assembly illustrating internal plug-in connectors for mating the two and for the exchange of signals between the two.

In the presently contemplated embodiment, multi-conductor connectors mate when the control sub-assembly is mounted on or attached to the power sub-assembly. FIG. 3 illustrates the control sub-assembly 14 removed from the power sub-assembly, and shows the multi-conductor connectors 20 and 22 that interface with one another when the two sub-assemblies are brought together to transfer power and data between the control sub-assembly and the power sub-assembly. That is, in the presently contemplated embodiment, the control sub-assembly 14 does not contain the means for supplying its own power (e.g., a battery), but receives power from the power sub-assembly 12 when the two are connected. Moreover, the control sub-assembly 14 performs all computations, implements all control routines, and generates all control signals that are applied to the power circuitry within the power sub-assembly (as described more fully below) via the multi-conductor connectors. The connectors 20 and 22 are provided on sides of the control sub-assembly and power sub-assembly that face one another and are exposed only when the sub-assemblies are separated, as indicated by reference numerals 24 and 26. That is, the facing sides are not accessible when the two sub-assemblies are mated.

Figure 4:
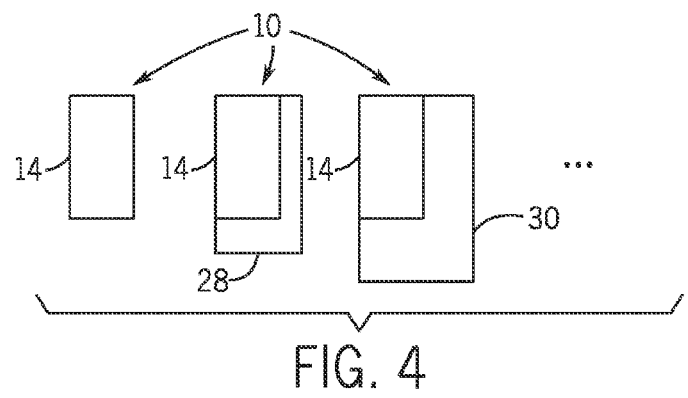
FIG. 4 is an exemplary illustration of how the same control sub-assembly may be used with different power sub-assemblies having different ratings.

Although FIGS. 1-3 illustrate a control sub-assembly that is generally co-extensive with the power sub-assembly, it is presently contemplated that the same control sub-assembly may serve to accommodate various power sub-assemblies that increase in both size and rating. FIG. 4 illustrates three such arrangements. In the first, the control sub-assembly 14 is shown over a power sub-assembly which is located behind the control sub-assembly, the two sub-assemblies being generally co-extensive with one another. As indicated by reference numerals 28 and 30, however, power sub-assemblies of larger sizes and ratings may be coupled to the same control sub-assembly 14. The power sub-assemblies mate and interface in similar manners, and the circuitry within the control sub-assembly is designed to allow for motors of various sizes to be driven without altering the hardware or circuitry within the control sub-assembly. Such larger sizes are accommodated only by programming changes within the control sub-assembly. In presently contemplated embodiments, for example, power sub-sections having ratings of 0.4 to 22 kw/0.5 to 30 hp at 400/480V, with global voltage classes of 110V, 200V, 400V and 600V may be accommodated by the same control sub-assembly. However, other sizes and weightings may, of course, be envisaged.

In accordance with presently contemplated embodiments, the power sub-assembly comprises power electronic devices (e.g., switches) that regulate the conversion power from a power source to controlled frequency AC output for driving the electric motor. The control sub-assembly, on the other hand, comprises processing capabilities, motor control routines, parameters utilized by the routines for motor control, operator interface circuitry, and so forth to provide control signals for the power electronics of the power sub-assembly. The control signals are applied to the circuitry within the power sub-assembly based on the motor control routines and any further processing in the power sub-assembly converts these control signals to timing signals for driving the gates of power electronic switches within the power sub-assembly.

Figure 5:
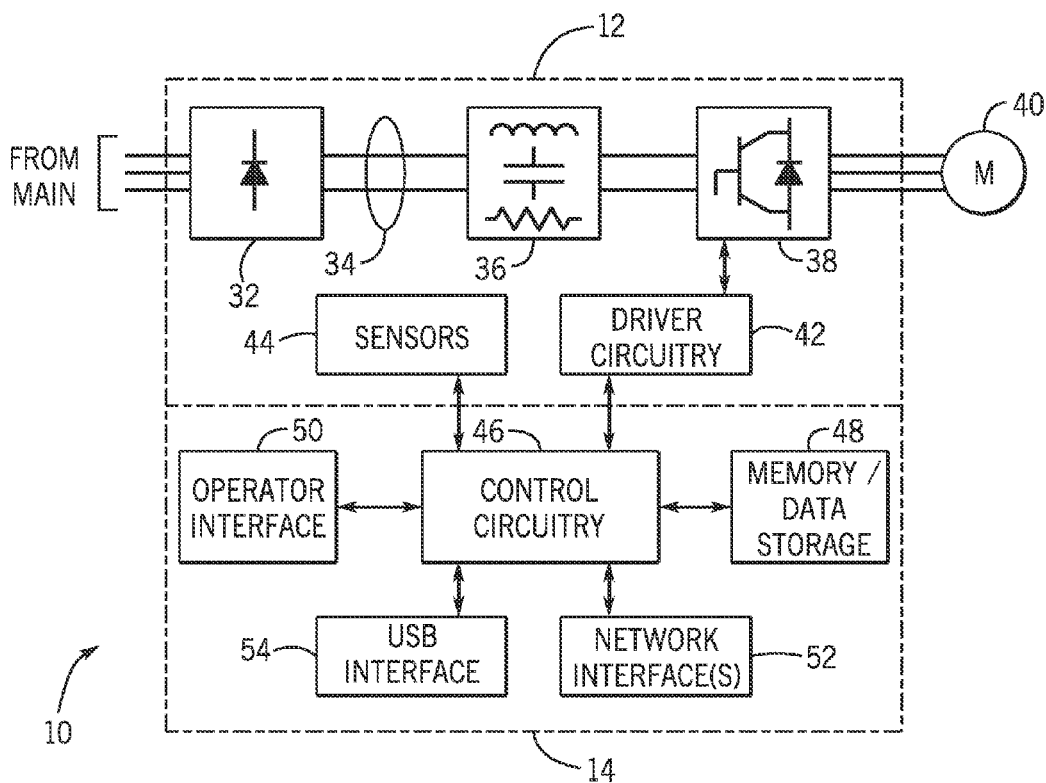
FIG. 5 is a diagrammatical representation of certain of the functional circuitry contained in the power sub-assembly and control sub-assembly.

This general topology is illustrated diagrammatically in FIG. 5. As shown in FIG. 5, the power sub-assembly 12 is designed to receive power from a power grid or main, or more generally from an input power supply. The power will typically be applied by conductors or busses, and the drive system may be, where desired, mounted near or remote from an electric motor that is driven by the system in operation. In certain embodiments and installations, the motor drive system may be rigidly mounted in a cabinet, on rails, or in any suitable manner. The incoming power may conform to various standards, depending upon the country or region in which the system is utilized, but will typically provide single or three-phase input power that is applied to a rectifier circuit 32. The rectifier circuitry may be passive or active, and where desired may allow for regenerated power to be applied back to the power source (e.g., during deceleration or braking of the load). The rectifier circuit 32 produces DC output that is applied to a DC bus 34. Various conditioning and support circuitry, illustrated generally by reference numeral 36 may be connected to the DC bus. As will be appreciated by those skilled in the art, such circuitry may include inductors, capacitors, resistors, and so forth. In general, inductors and capacitors may be utilized to store energy in the DC bus, and to smooth variations or ripple in the DC power, as well as to supply energy during certain periods of operation. Resistors may be provided for braking or dissipating energy, and so forth. DC power from the DC bus is applied to an inverter circuit 38, or more generally to a power converter circuit. The inverter circuit will typically include pairs or power electronic switches, such as insulated gate bipolar transistors (IGBTs) associated with diodes. These power electronic switches are driven to allow power to be drawn from the DC bus to form a synthetic sinusoidal output of a controlled frequency. The output power is then applied to an electric motor 40. While in many applications the drive system is configured to drive single or multi-phase AC motors, it should be noted that the drive system may be adapted for driving different motor types, such as permanent magnet motors.

In the illustration of FIG. 5, the power sub-assembly 12 also includes driver circuitry 42. The driver circuitry 42 acts based upon control signals received from the control sub-assembly to generate gate drive signals that are applied to the power electronic switches of the inverter circuitry 38. Where a switched rectifier is provided, such driver circuitry, or a separate circuit may similarly apply signals to the rectifier. The driver circuitry 42 may base the timing of the gate drive signals upon any desired algorithm, such as utilizing triangular carrier waves and other techniques generally known in the art. Finally, the power sub-assembly 12 may include various sensors, indicated collectively by the reference numeral 44, that detect feedback parameters, such as voltages, currents, position (electric motor) and so forth during operation. Signals to and from the driver circuitry 42 and from the sensors 44 are provided to the control sub-assembly via the multi-connectors discussed above.

The control sub-assembly 14 as illustrated in FIG. 5 comprises control circuitry 46 designed to implement one or more motor control routines based upon programmed parameters stored within the control sub-assembly. The control circuitry 46 may comprise any suitable processor or multiple processors, including micro-processors, field programmable gate arrays, dedicated application specific integrated circuits, and so forth. Memory circuitry, indicated generally by reference numeral 48 is associated with the control circuitry and allows for storage of motor control routines, parameters referred to by the routines, as well as a vast array of other information that may be useful for controlling and monitoring the motor. An operator interface 50 is further coupled to the control circuitry to allow for access to certain parameters, for alteration of programming and parameters, and so forth, such as via the operator interface illustrated in FIG. 1. One or more network interfaces 52 may be provided for similarly accessing certain information from the drive system. Such interfaces may include an EtherNet interface, various industrial data exchange protocol interfaces (e.g., DeviceNet, ControlNet, Profibus, Modbus, etc.). EtherNet capability allows the drive system to be integrated into an EtherNet IP infrastructure, and the use of a dual port EtherNet card may permit connectivity options such as device level ring networking Finally, a universal serial bus (USB) interface 54 is provided in the illustrated embodiment. While one or more of these interfaces may be accessible from outside the drive system when assembled, in a presently contemplated embodiment the network interfaces 52 are accessible when the control sub-assembly is mounted on the power sub-assembly, while the USB interface, which allows for file transfer and configuration of the drive system, is not accessible unless the control sub-assembly is removed from the power sub-assembly. Where desired, the drive system may be protected by the use of passwords or other security devices.

FIG. 6 illustrates a presently contemplated embodiment for the control sub-assembly 14. The assembly as shown in FIG. 6 with certain sub-components exploded to illustrate the construction. The control sub-assembly 14 comprises a housing 56 made of a moldable plastic material and a removable cover 58, typically made of a similar material. The cover 58 can be removed to expose an interior region 60 that can be readily accessed by initial installers, service personnel, and so forth for connecting the sub-assembly to external sensors, actuators, and the like. The sub-assembly further includes a circuit board assembly 62 that in the illustrated embodiment includes a main circuit board 64 and an interface board 66. During operation, signals are transmitted within and between these circuit boards and are created and managed by components populated on the boards, in a manner generally known in the art. However, uniquely, the main circuit board 64 is designed and populated to allow for access to the interior of the sub-assembly while inherently isolating higher voltage signals from the portion of the interior that is accessed.

Illustrated in FIG. 6 is an input/output terminal block 68 that allows for interfacing of the main circuit board with the external sensors, actuators, and so forth (not shown). Various other components may be included, such as network interfaces, plugs, terminals, and so forth. All of these are provided in the section of the control sub-assembly that is covered by the cover 58. To isolate access to these components, the main circuit board 64 is designed with 2 separate regions. In the illustrated embodiment, for example, a high voltage region 72 is physically separated from a local region 74 as illustrated by a line of demarcation 70. The line of demarcation is generally defined by the layout of the main circuit board so that high voltage components are located in the high voltage region 72 and the low voltage region 74 is limited to low voltage components. As noted above, the term "high voltage" in the present context may be considered to include voltages on the order of 110 v AC, single phase, and high 3-phase voltages, such as 440 v AC. The term "low voltage" may refer to logic level voltages, such as on the order of 5 v DC and below. Depending upon the geographical region and the standards applicable in such regions, however, these definitions may differ. In general, however, the demarcation of the main circuit board allows for restricted access to that portion of the interior of the control sub-assembly in which components that require access are disposed, such as input/output terminals, network connections, and so forth. In a presently contemplated embodiment, the restricted access during powered up operations is in accordance with IEC 60529 provided by enclosures IP20.

Several features of the control sub-assembly are designed to provide inherent isolation between the high voltage region 72 and a low voltage region 74 of the main circuit board. It should be noted that the interface board 66 is also isolated by these same features. In the illustrated embodiment, for example, a vented wall 76 is integrally molded into the housing 56 to prevent objects from moving toward the high voltage region 72 of the main circuit board. Similar barriers may be added to the structure, although the integral molding of the vented wall reduces cost and provides a reliable and integral structure. In certain designs, optocoupler may be used to link certain components of the high voltage and low voltage regions of the main circuit board, and/or portions of the interface board, but the illustrated embodiment may be used to significantly reduce the need or number of such optocouplers, thereby reducing the number of overall components and the cost of the overall sub-assembly.

In addition to the vented wall 76, structures are provided that allow for spacing within the control sub-assembly to further facilitate packaging and to allow for isolation. As illustrated in the preceding figures, the operator interface 18 may include integral regions that may be pressed by an operator for interfacing with the control sub-assembly. It also includes or may include in certain embodiments, a display 78 that provides numerical and/or textural or symbolic feedback for the operator. This display is packaged in the sub-assembly under the operator interface and spacing for the display is inherently provided by a riser in which the operator interface is disposed. Similarly, spacing is provided by a series of tact switches 80 that are mounted to the interface board 66. As will be appreciated by those skilled in the art, these switches are designed to change states, providing operator inputs upon being depressed. In the illustration of FIG. 6, a membrane or a cover 82 has been shown exploded to expose integral spring structures 84 that are molded into the housing 56. These underlie regions that may be depressed by the operator, and overlie individual tact switches 80. That is, comparing FIG. 1 to FIG. 6, graphics, tact or regions, or the like may be provided in the membrane 82 that correspond to locations of the integral spring structures 84 and tact switches 80.

These structures are illustrated in the further exploded view of FIG. 7. In FIG. 7, the housing 56 is shown exploded from the tact switches 80, with the interface board 66 and main circuit board 64 further exploded to illustrate the exemplary construction. Other components have been eliminated from this view for clarity sake. As noted above, here again, the main circuit board 64 is sub-divided into a high voltage region 72 and low voltage region 74 along a general line of demarcation 70. The line of demarcation generally corresponds to the location of the vented wall 76 shown in the housing 56. The interface board 66 lies within the protected area of the interior of the sub-assembly on the high voltage side of the vented wall 76. The tact switches, which will in the final assembly be mounted to the top side of the interface board 66 correspond in location to integral spring structures 84, the bottoms of which are shown in FIG. 7.

Figure 9:
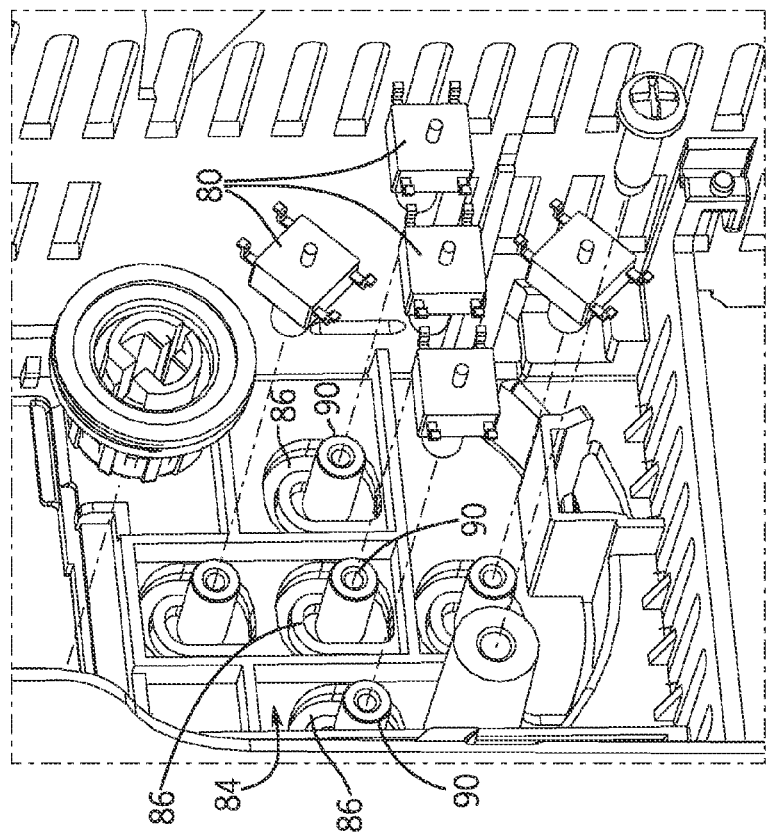
FIG. 9 is a more detailed exploded view of the spring structures along with integral plungers and tact switches.

FIGS. 8 and 9 illustrate the placement and construction of the integral spring structures that interface with the tact switches and allow for interaction with the operator interface while inherently providing spacing from the high voltage components below. As best shown in FIG. 8, the integral spring structures 84 are molded with the housing 56, and each include a spring-like extension 86 that partially spirals and is cantilevered toward a core 88. That is, the housing, the spring extensions, and the cores are all made of the same material and formed in the same molding process. Such structures could, of course, be assembled, although the inherent molding of these together facilitates manufacturing and reduces cost. As best shown in the rearview of FIG. 9, each integral spring structure further includes a plunger 90 that is integrally formed with the respective core and extends rearwardly to interface with a corresponding tact switch 80.

Figure 10:
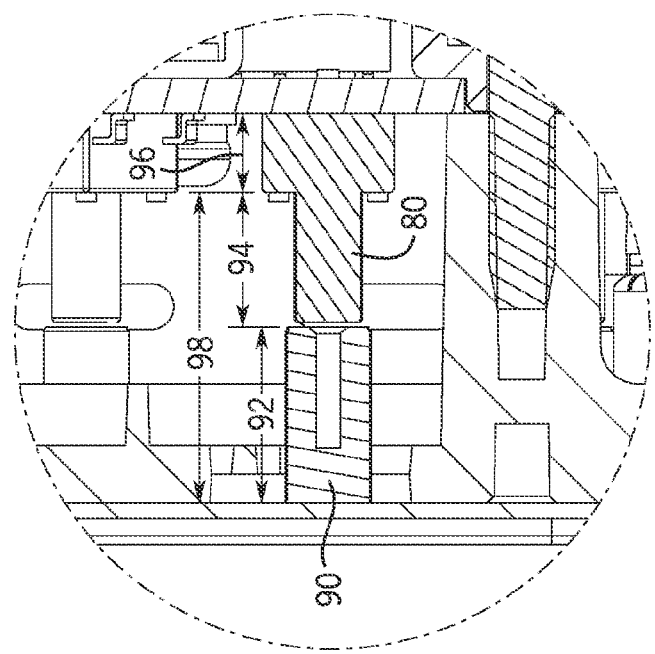
FIG. 10 is a sectional view illustrating how the plungers and tact switches interact in the assembled control sub-assembly.

The placement and dimensions of the integral spring structures, their cores, their spring extensions, and particularly their plungers, allow for designing spacing both for components such as the display 78 (see FIG. 6) and for desired spacing between the surface of the sub-assembly on which the operator interface membrane is placed, and higher voltage components, such as the interface board and main circuit board. As best illustrated in FIG. 10, each integral spring structure has a plunger 90 that extends towards and contacts a corresponding tact switch 80. The tact switch, which is typically a purchased component thus defines the location of the integral spring structure and plunger. The plunger length 92 will typically be selected to provide the desired spacing, with the length of the tact switch, indicated by reference numeral 94, combining with this length to provide an overall length 98 that offers the spacing desired. The base height 96 of the tact switch adds to this length to provide the final spacing between the underlying circuit board and the top surface of the housing. Thus, here again, spacing and isolation are provided between those surfaces and regions accessed by the operator and the circuit boards that may function at and provide signals at a higher voltage.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A motor drive comprising:
a control sub-assembly main circuit board subdivided into a high voltage region and a low voltage region;
a plastic housing having an interior in which the control sub-assembly main circuit board is disposed;
at least one component disposed in the interior and designed to be accessed by an operator during installation and/or maintenance of the motor drive; and
a plastic barrier integral with the housing and comprising only plastic material disposed in the housing to limit access to the high voltage region of the control sub-assembly main circuit board while allowing access to the at least one component.

2. The motor drive of claim 1, wherein the barrier comprises a vented wall.

3. The motor drive of claim 1, wherein the barrier is integrally molded in the housing.

4. The motor drive of claim 1, comprising an operator interface disposed in the housing.

5. The motor drive of claim 4, wherein the operator interface is disposed over the high voltage region of the control sub-assembly main circuit board and is limited in access by the barrier.

6. The motor drive of claim 4, wherein the housing comprises integral spring structures that are deformed by an operator interacting with the interface.

7. The motor drive of claim 6, wherein each integral spring structure includes an integral plunger that interfaces with a respective switch when the respective spring structure is deformed by an operator interacting with the interface.

8. The motor drive of claim 7, wherein the plungers have a length selected to provide desired spacing between the interface and an underlying circuit board.

9. A motor drive comprising:
a control sub-assembly main circuit board subdivided into a high voltage region and a low voltage region;

a plastic housing having an interior in which the control sub-assembly main circuit board is disposed;

at least one component disposed in the interior and designed to be accessed by an operator during installation and/or maintenance of the motor drive;

a plastic barrier comprising only plastic material integral with and disposed in the housing to limit access to the high voltage region of the control sub-assembly main circuit board while allowing access to the at least one component; and an operator interface disposed over the high voltage region of the control sub-assembly main circuit board, wherein access to the operator interface is limited by the barrier, and wherein the housing comprises spacing plungers that provide a desired spacing between the a surface of the operator interface and an underlying circuit board.

10. The motor drive of claim 9, wherein the barrier comprises a vented wall.

11. The motor drive of claim 9, wherein the barrier is integrally molded in the housing.

12. The motor drive of claim 9, wherein the housing comprises integral spring structures that are deformed by an operator interacting with the interface.

13. The motor drive of claim 12, wherein each integral spring structure includes one of the spacing plungers, and wherein each spacing plunger interfaces with a respective switch when the respective spring structure is deformed by an operator interacting with the interface.

14. A motor drive comprising:
a control sub-assembly main circuit board subdivided into a high voltage region and a low voltage region;
a plastic housing having an interior in which the control sub-assembly main circuit board is disposed;
a plastic barrier integral with the housing and comprising only plastic material disposed in the housing to limit access to the high voltage region of the control sub-assembly main circuit board while allowing access to the low voltage region; and
an operator interface disposed over the high voltage region of the control sub-assembly main circuit board, wherein the housing comprises integral spring structures that are deformed by an operator interacting with the interface.

15. The motor drive of claim 14, wherein each integral spring structure includes an integral plunger that interfaces with a respective switch when the respective spring structure is deformed by an operator interacting with the interface.

16. The motor drive of claim 15, wherein the plungers have a length selected to provide desired spacing between the interface and an underlying circuit board.

17. The motor drive of claim 14, comprising at least one component disposed in the interior and designed to be accessed by an operator during installation and/or maintenance of the motor drive, and a barrier disposed in the housing to limit access to the high voltage region of the control sub-assembly main circuit board while allowing access to the at least one component.

18. The motor drive of claim 17, wherein access to the operator interface is limited by the barrier.

19. The motor drive of claim 17, wherein the barrier comprises a vented wall.

20. The motor drive of claim 17, wherein the barrier is integrally molded in the housing.

* * * * *